United States Patent
Spies et al.

(10) Patent No.: US 6,462,267 B1
(45) Date of Patent: Oct. 8, 2002

(54) EMI SHIELDING GASKET HAVING A CONSOLIDATED CONDUCTIVE SHEATHING

(75) Inventors: George H. Spies, Wakefield, MA (US); Richard A. Hamel, Derry, NH (US); Jonathan E. Mitchell, Cambridge, MA (US); William Lionetta, Winchester, MA (US); James A. Bradley, Billerica, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 09/356,426

(22) Filed: Jul. 19, 1999

Related U.S. Application Data

(60) Continuation of application No. 09/097,033, filed on Jun. 12, 1998, which is a division of application No. 08/691,718, filed on Aug. 2, 1996, now Pat. No. 5,902,956.
(60) Provisional application No. 60/003,032, filed on Aug. 25, 1995.

(51) Int. Cl.[7] .................................................. H05K 9/00
(52) U.S. Cl. .................................. 174/35 GC; 277/653; 277/920
(58) Field of Search ................... 174/35 GC, 35 R; 277/650, 652, 653, 920; 361/816, 818

(56) References Cited

U.S. PATENT DOCUMENTS

| | | | |
|---|---|---|---|
| 2,112,294 A | | 3/1938 | Lilley |
| 2,146,966 A | | 2/1939 | Lilley |
| 2,253,000 A | | 8/1941 | Francis |
| 2,313,058 A | | 3/1943 | Francis |
| 2,424,743 A | | 3/1947 | Davis |
| 3,002,334 A | * | 10/1961 | Yasuno ...................... 428/377 |
| 3,089,379 A | * | 5/1963 | Finor et al. .................. 87/214 |
| 3,446,002 A | | 5/1969 | Kippan |
| 3,446,004 A | | 5/1969 | Wilterink |
| 3,458,987 A | | 8/1969 | Ozawa et al. |
| 3,644,866 A | * | 2/1972 | Dearduff ..................... 338/214 |

(List continued on next page.)

FOREIGN PATENT DOCUMENTS

| | | | |
|---|---|---|---|
| DE | 90 13 936.4 | | 1/1991 |
| DE | 91 13 382.3 | | 2/1992 |
| GB | 821442 | * | 10/1959 |
| GB | 2256092 A | | 11/1992 |

OTHER PUBLICATIONS

Severingen, J., "Gaskets That Block EMI," Machine Design, vol. 47, No. 19, pp. 74–77 (Aug. 1975).
Instrument Specialties Product Sample.
Copy of International Search Report for corresponding PCT Case No. PCT/US/96/12602.

*Primary Examiner*—Hung V. Ngo
(74) *Attorney, Agent, or Firm*—John A. Molinar, Jr.; William S. Gosz

(57) ABSTRACT

An electromagnetic interference (EMI) shielding gasket. The gasket is formed as having a resilient core member of an indefinite length which is sheathed in an electrically conductive fiber mesh member. A thermoplastic member is incorporated within the fiber mesh member for consolidating at least a portion of the fiber mesh member. The consolidation is effective to maintain the integrity of the fiber mesh member at an end of the gasket when the gasket is terminated to a determinable length.

10 Claims, 2 Drawing Sheets

U.S. PATENT DOCUMENTS

| | | | |
|---|---|---|---|
| 3,710,008 A | * | 1/1973 | Sawyer ........................ 29/825 |
| 4,016,714 A | | 4/1977 | Crandall et al. |
| 4,299,884 A | * | 11/1981 | Payen ........................ 428/377 |
| 4,640,179 A | | 2/1987 | Cameron |
| 4,684,762 A | | 8/1987 | Gladfelter |
| 4,857,668 A | | 8/1989 | Buonanno |
| 4,893,665 A | | 1/1990 | Reuter et al. |
| 4,921,751 A | | 5/1990 | Wakahara et al. |
| 4,931,326 A | * | 6/1990 | Well ........................ 428/35.8 |
| 4,952,448 A | | 8/1990 | Bullock et al. |
| 5,028,739 A | | 7/1991 | Keyser et al. |
| 5,105,056 A | | 4/1992 | Hoge, Jr. et al. |
| 5,142,101 A | | 8/1992 | Matsuzaki et al. |
| 5,179,778 A | * | 1/1993 | Dickson et al. ................ 29/826 |
| 5,202,536 A | | 4/1993 | Buonanno |
| 5,386,345 A | * | 1/1995 | Matsuzaki et al. .......... 361/816 |
| 5,416,961 A | * | 5/1995 | Vinay ........................... 28/165 |
| 5,512,709 A | | 4/1996 | Jencks et al. |
| 5,555,618 A | * | 9/1996 | Winkler ....................... 29/825 |
| 5,557,846 A | * | 9/1996 | Wei et al. .................. 29/889.2 |
| 5,889,229 A | | 3/1999 | Sosnowski ............. 174/35 GC |

\* cited by examiner

EMI SHIELDING GASKET HAVING A CONSOLIDATED CONDUCTIVE SHEATHING

RELATED CASES

This application is a continuation of pending U.S. application Ser. No. 09/097,033, filed Jun. 12, 1998; which is a divisional of U.S. application Ser. No. 08/691,718, filed Aug. 2, 1996, now U.S. Pat. No. 5,902,956, which claims priority of U.S. Provisional Serial No. 60/003,032, filed Aug. 25, 1995, the disclosures of which are incorporated herein by reference

BACKGROUND OF THE INVENTION

The present invention relates broadly to an electromagnetic interference (EMI) shielding gasket or seal having a resilient core and a conductive fiber mesh sheathing which is consolidated to mitigate its unraveling or splaying when the gasket is terminated to a determinable length.

The operation of electronic devices such as computers, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., from between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

Conventionally, the EMI shielding gaskets heretofore known in the art have involved a resilient core element having gap-filling capabilities, around which is provided a conductive, tubular sleeve or other sheathing. The resilient core element typically is formed of an elastomeric foam which may be a foamed elastomeric thermoplastic such as a polyethylene, polypropylene, polypropylene-EPDM blend, butadiene, styrene-butadiene, nitrile, or chlorosulfonate, or a foamed neoprene, urethane, or silicone. Alternatively, an unfoamed silicone, urethane, neoprene, or thermoplastic may be utilized in either a solid or tubular form. Resilient, thermoplastic elastomeric foams and methods for making the same are detailed in U.S. Pat. Nos. 5,393,796; 5,070,111; and 4,898,760.

The sheathing may be provided as a woven or non-woven fabric, or as a knitted mesh. Knitted meshes may be preferred from a manufacturing standpoint as eliminating such fabrication steps as slitting, wrapping, and adhering which are necessitated with the use of fabric sheathing. The fabric or mesh may be formed of a metal wire such as copper, nickel, silver, aluminum, tin or an alloy such as Monel, or of other conductive fibers such as carbon, graphite, or a conductive polymer. Alternatively, nonconductive natural or synthetic fibers such as cotton, wool, silk, cellulose, polyester, polyamide, nylon, polyamide, or the like may be plated or otherwise coated with a conductive material such as metal, carbon, or the like. Depending upon the needs of the specific application for the seal, a combination of conductive and nonconductive fibers may be used. Preferred sheathing materials include nylon or polyester yarn plated with silver, copper, nickel, or tin.

A representative EMI shielding gasket which includes a resilient foam core within a conductive sheath is disclosed in Buonanno, U.S. Pat. No. 4,857,668. The sheath is bonded to the foam core as an integral part of a continuous molding process in which the foam is blown or expanded within the sheath. As the foam cures, a sealed outer boundary layer forms on the surface thereof which faces the inner surface of the sheath. The outer boundary layer is stated to have an adhesive character which effects a strong bond between the foam core and the sheath.

Buonanno, U.S. Pat. No. 5,202,536, discloses an EMI seal having an elongated, resilient core which is covered with a partial conductive sheath. A conductive portion of the sheath, preferably a metallized fabric or the like in a resin binder, is provided to extend partially around the core to define ends which are non-overlapping. A second, nonconductive sheath portion is attached to the core element to extend between the ends of the conductive sheath portion. The seal may be produced in accordance with the continuous molding process described in U.S. Pat. No. 4,857,668. Alternatively, the core may be pre-molded with the conductive and nonconductive sheath portions being attached thereto with an adhesive or the like.

Keyser et al., U.S. Pat. No. 5,028,739 discloses another EMI shielding gasket which includes a resilient, elastomeric core enveloped within a fine, open format knit or braided wire mesh. An adhesive strip is disposed lengthwise along a surface of the gasket which allows the gasket to be removably fastened directly to an enclosure.

Matsuzaki et al., U.S. Pat. No. 5,142,101, discloses yet another EMI shielding gasket having a resilient core to which a metal mesh is adhered with a rubber macromolecule adhesive or the like. The core includes a body portion for contact with a first surface of a joint of a conductive housing, and an installing portion which may be inserted into a second surface of the joint. A segregating portion is formed between the body and installation portions which separates the metal mesh from the surface of the core such that the mesh is not broken as the core is elasticly deformed during its insertion into the joint.

Although gaskets of the type herein involved have represented important advancements in the art of EMI shielding, a problem has continued to plague the industry. Namely, it has been observed that when gaskets of such type are sectioned or otherwise terminated to length for mounting within the boundaries of an interface to be sealed, the sheathing at the terminal end or ends of the gasket may have a tendency to splay or unravel. Apart from deleteriously affecting the conductivity of the sheathing, the unraveling of the conductive fibers of the sheathing may cause shorting within the electrical circuitry which is enclosed within the housing being sealed. Gaskets having a sheathing of a relatively open, interlocked knit or braided structure are particularly prone to unraveling at the terminal ends thereof, with gaskets having a sheathing of a tighter, woven fabric being more stable.

Indeed, it is known to attach a fabric and other sheathing to a foam core with a pressure sensitive adhesive or the like. However, with respect to sheathings such as knitted fiber meshes having a relatively more open structure, such adhesives are not acceptable as having a tendency to migrate or bleed through the loops of the knit while under an applied pressure. The performance of the gasket thereby may be affected as the extraneous adhesive may interfere with the removability of a mating surface therefrom. Another shielding gasket manufactured by Instrument Specialties, Inc., of Delaware Water Gap, Pa., includes a bead of an unfilled, organic polymer between a first and second layer of sheathing fibers to effect a bond therebetween. Such technique, however, necessitates a complex sheathing weave which cannot be attained with conventional circular knitting machines commonly used to form knit sheathings.

The EMI shielding industry has otherwise responded to the problem associated with the sectioning of shielding gaskets by providing an outer "tie-coat" on the shielding. For example, a gasket marketed under the name Soft Shield IIΘ by Chomerics, Inc., of Woburn, Mass., incorporates an outer coating of a silicone or the like for maintaining the integrity of the terminal ends of the gaskets. Such coating, however, must be applied in a separate processing step which increases the costs of manufacturing the gasket.

Thus, the sectioning to length or other termination of the EMI gaskets and seals heretofore known in the art has generally lead to unacceptable conditions, or has necessitated the involvement of a separate manufacturing step. It therefore will be appreciated that improvements in EMI shielding gaskets and seals, and in the methods for terminating the same, would be well-received by electronics manufacturers and other industries.

BROAD STATEMENT OF THE INVENTION

The present invention is directed to an electromagnetic interference (EMI) shielding gasket or seal having a resilient core inner member and a conductive fiber mesh outer member, at least a portion of which is consolidated to mitigate its unraveling when the gasket is sectioned or otherwise terminated to length. In providing for the incorporation of a thermoplastic member within, i.e., in or adjacent, the fiber mesh member, the present. invention affords an EMI shielding gasket having a consolidated fiber mesh member, the integrity of which is maintained at the ends thereof when the gasket is cut, sectioned, or otherwise terminated into a determinable length for mounting within a housing or the like. Thus, the problems heretofore associated with the sectioning of EMI shielding gaskets, including the splaying or unraveling of the ends thereof, and the potential for unwanted introduction of the fibers of the sheathing into the electronic circuitry being shielded, are thereby mitigated.

It therefore is a feature of the present invention to provide an EMI shielding gasket having a resilient core member of an indefinite length which is sheathed in an electrically conductive fiber mesh member. A thermoplastic member is incorporated within the fiber mesh member for consolidating at least a portion of the fiber mesh member. The consolidation is effective to maintain the integrity of said fiber mesh member at an end of the gasket when the gasket is terminated to a determinable length.

It is a further feature of the invention to provide a method of terminating at least one end of an EMI shielding gasket of an indefinite length. A resilient core member of an indefinite length is sheathed within an electrically conductive fiber mesh member. A thermoplastic member is incorporated within the conductive fiber mesh member, and then is heated to effect its melting which, in turn, effects the consolidation of at least a portion of the fiber mesh member. The gasket, so formed then may be terminated to a determinable length having an end through a consolidated portion of said fiber mesh member. The consolidated portion is effective to maintain the integrity of said fiber mesh member at the terminated end.

Advantages of the present invention include the provision of an EMI shielding gasket having a consolidated fiber mesh outer member, the integrity of which is maintained when the gasket is sectioned or otherwise terminated to length. Additional advantages include an EMI shielding gasket having a thermoplastic consolidation member which may be incorporated within the a fiber mesh sheathing member in a single processing step. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

The drawings will be described further in connection with the following Detailed Description of the Invention.

DETAILED DESCRIPTION OF THE INVENTION

Figure 1:
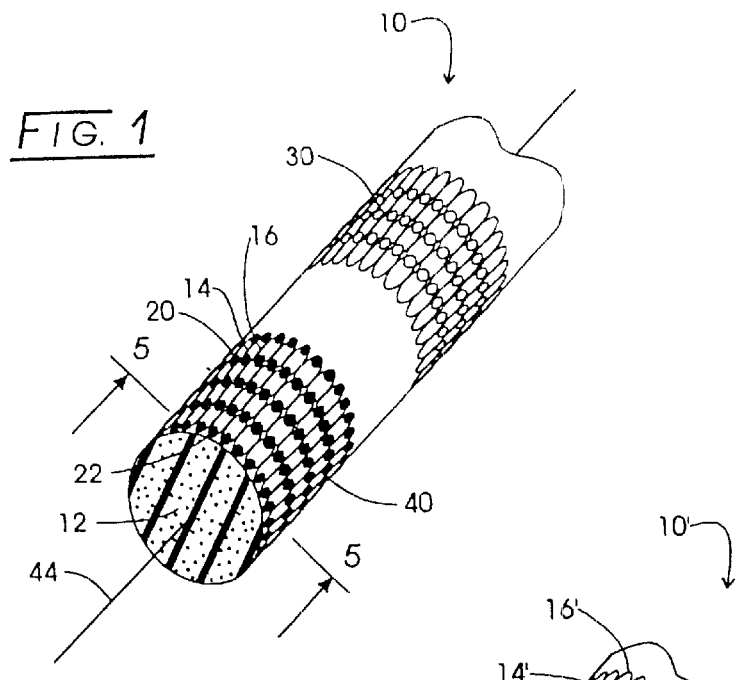
FIG. 1 is a perspective view of an electromagnetic interference (EMI) shielding gasket fabricated in accordance with the present invention as having a resilient core member sheathed in a electrically conductive fiber mesh member, at least a portion of which has been consolidated with a thermoplastic member.

Referring to FIG. 1, an electromagnetic interference (EMI) shielding gasket according to the present invention is shown generally at 10 as adapted to be received within an interface, such as between a door, panel, hatch, cover, or other parting line of an electromagnetic interference (EMI) shielding structure (not shown). The EMI shielding structure may be the conductive housing of a computer, cellular phone, or other electronic device which generates EMI radiation: or is susceptible to the effects thereof. Gasket 10 may be bonded or fastened to, or press-fit into one of a pair of mating surfaces which define the interface within the housing, and functions between the mating surfaces to seal any interface gaps or other irregularities. That is, while under an applied pressure, gasket 10 conforms to any such irregularities both to establish a continuous conductive path across the interface, and to seal the interior of the housing from the ingress of dust, moisture, or other contaminates. For illustrative purposes, gasket 10 is shown to be of an indefinite length which may cut, sectioned, or otherwise terminated for sizing to the periphery of the interface to be sealed.

In cross-section, gasket 10 may be seen to include a inner resilient core member, 12, of an indefinite length which is sheathed within an outer, electrically conductive fiber mesh member, 14. For affording gap-filling capabilities, core member 12 is preferred to be complaint over a wide range of temperatures, and to exhibit good compression-relaxation characteristics even after repeated cyclings or long compression dwells. Core member 12 therefore may be provided as formed of a foamed elastomeric thermoplastic such as a polyethylene, polypropylene, polypropylene-EPDM blend, butadiene, styrene-butadiene, nitrile, chlorosulfonate, or a foamed neoprene, urethane, or silicone. Preferred materials for core member 12 include open or closed cell, extruded and cut foams formed of a foamed urethane or Santoprene7 (polyolefin resin/monoolefin copolymer blend, Advanced Elastomeric Systems, L.P., St. Louis, Mo.), or a neoprene, silicone, or nitrile sponge rubber. Although core member 12 is shown as having a generally circular cross-section, other profiles such as polygonal or elliptical may be substitute depending upon the geometry of the interface to be sealed. Likewise, core member 12 may be of any diametric extent, but for most applications will have a diameter or width of from about 0.25 inch (0.64 cm) to 1 inch (2.54 cm).

Outer fiber mesh member 14 preferably is wound from an electrically-conductive, continuous fiber, 16, which is knitted over a pre-molded inner core member 12. Looking momentarily to FIG. 3 wherein a portion of mesh member 14 is shown in enhanced detail, it may be appreciated that mesh member 14 is of an interlocking, looped or circular knit construction having a relatively open format with less than about 30–35 openings, one of which is referenced at 18, per inch. Knits of this general type are described further in U.S. Pat. Nos. 5,028,739 and 4,857,668. Fiber 16 may be a single-strand of an electrically-conductive fiber or wire having a thickness of from about 2–10 mils, or, alternatively, a multi-stranded wire having a thickness of 2–10 mils, or a multi-stranded yarn, thread, or the like having a denier of from about 50–1200, with yarn of a 300–600 denier being preferred for most applications. In this regard, fiber 16 may be a metal wire such as copper, nickel, silver, aluminum, tin or an alloy such as Monel, or a single- or multiple-stranded other conductive fiber such as carbon, graphite, or a conductive polymer. Alternatively, fiber 16 may be a single- or multiple-stranded, nonconductive natural or synthetic fiber such as cotton, wool, silk, cellulose, polyester, polyamide, nylon, polyamide, or the like which is coated with a conductive material such as a metal, carbon, or the like. Preferred fibers include silver-coated nylon yarn, e.g., 108 denier multifill nylon yarn having 20% by weight of silver plated thereon (Sauquoit Industries, Inc., Scranton, Pa.), and wires such as Monel, silver-plated copper, nickel-clad copper, Ferrex7, aluminum, tin-clad copper, and phosphor bronze. Depending upon the needs of the specific application for gasket 10, a combination of conductive and nonconductive fibers may be used.

Returning to FIG. 1, it may be seen that a thermoplastic member, represented at 20, is incorporated within, i.e., in or adjacent, fiber mesh member 14. In accordance with the precepts of the present invention, thermoplastic member 20 consolidates at least a portion of fiber mesh member 14 effective to maintain the integrity of the member at a terminal end, shown at 22, of gasket 10 when the gasket is cut, sectioned, or otherwise terminated to length to form end 22. By "consolidates" it is meant that thermoplastic member 20 binds fiber 16 into an integral mesh member 14 such that when gasket 10 is sectioned or otherwise has a terminal end, fiber 16 does not splay or unravel. Such consolidation is to be contrasted with the mere bonding of the sheathing to the core member with a pressure sensitive adhesive or the like.

Figure 2:
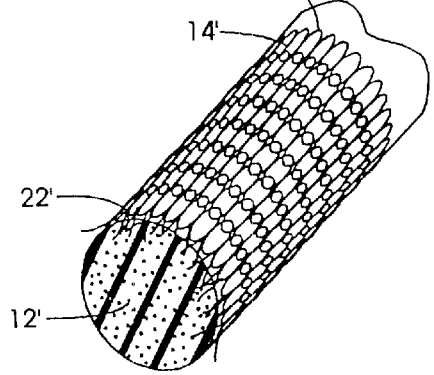
FIG. 2 is a perspective view of an EMI shielding gasket fabricated in accordance with the prior art as having an unconsolidated fiber mesh member sheathing which is splayed and unraveled at a terminal end of the gasket.

For purposes of comparison, reference may be had momentarily to FIG. 2 wherein an EMI shielding gasket substantially in accordance with the prior art is shown at 10' to include an inner core member, 12', and an outer, electrically conductive fiber mesh member, 14'. Again, fiber mesh member 14' is of a relatively open, looped construction, and may be formed, as before, of a continuous fiber, 16', which is knitted over a pre-molded inner core member 12'. However, as lacking thermoplastic member 20 (FIG. 1) of the present invention, fiber mesh member 14' of the prior art is known to splay or unravel, at terminal end 22' for example, when gasket 10' is sectioned to length. As aforementioned, such unraveling of fiber mesh member 14' may deleteriously affect the electrical conductivity of the sheathing, and may causing shorting within the circuitry of the device being housed or otherwise shielded. No such affects are observed, however, with respect to gasket 10 (FIG. 1) of the present invention by virtue of thermoplastic member 20 thereof.

Returning again to FIG. 1, thermoplastic member 20 preferably is incorporated within fiber mesh member 14 as a heat-fusible material which softens, melts, shrinks, and/or flows above a specified melting or glass transition temperature. Accordingly, thermoplastic member 20 is incorporated within mesh member 14 in a fiber or film form, and then is heated to soften, melt, and/or flow into or around fiber 16 of mesh member 14 for its consolidation into an integral structure. Thermoplastic member 20 therefore is selected as having a glass transition and/or melting temperature below the transition, melting, or degradation temperatures of mesh member 14 and core member 12. For illustrative purposes, fiber mesh member 14 of gasket 10 is shown in FIG. 1 as having an unheated/unconsolidated portion, 30, and a heated/consolidated portion 40.

Figure 3:
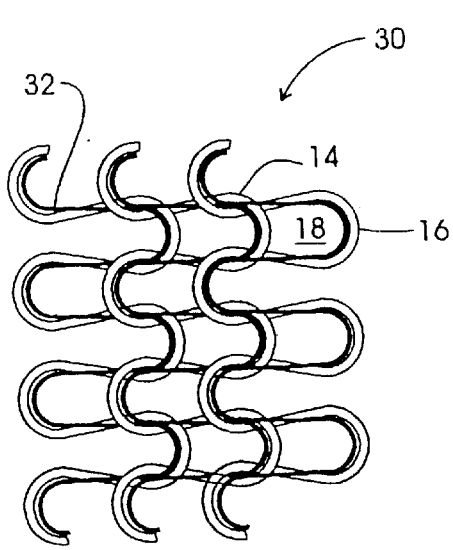
FIG. 3 is a view of an unconsolidated/unheated portion of the fiber mesh member of the EMI shielding gasket of FIG. 1 which is enlarged to detail the structure thereof as including a co-wound thermoplastic fiber member.

Looking next to FIG. 3 wherein portion 30 of fiber mesh member 14 is shown in enhanced detail prior to its heating and consolidation, a preferred embodiment of the EMI shielding gasket of the present invention is illustrated wherein thermoplastic member 20 is incorporated within fiber mesh member 14 as a thermoplastic fiber, 32, which is co-wound in a single processing step with conductive fiber 16 about a pre-formed core 12 (FIG. 1). In this regard, electrically conductive fiber 16 and thermoplastic fiber 32 may be co-knit over core member 12 by being co-spooled on a common bobbin of a circular knitter. It is preferred that thermoplastic fiber 32 be selected as 50–400 denier polyethylene, polypropylene, or Saran7 monofilament or yarn, although other polyolefinic fibers and other thermoplastic fibers formed of a polyamide, polycarbonate, polyester, polyvinyl acetate, or a combination, such as a copolymer, blend, or mixture, thereof may be substituted. Thermoplastic fiber 32 generally will comprise from between about 4% to 75% by weight of the consolidated sheathing.

So formed, gasket 10 of the present invention, which is illustrated in FIG. 1 as having both a heated and an unheated portion, then may be-exposed to a stream of hot air or gas, or passed through a heated die to convectively or radiantly heat the thermoplastic fiber 32 in unheated portion 30 thereof. Upon heating, and as is illustrated in FIGS. 4 and 5 wherein the heated portion 40 of gasket 10 is depicted, respectively, in enhanced detail and in cross-section, fiber 32 of unheated portion 30 (FIG. 3) is softened, melted, shrunk, or otherwise fused into thermoplastic member 20 which, upon cooling, solidifies to consolidate fiber mesh member 14.

Figure 4:
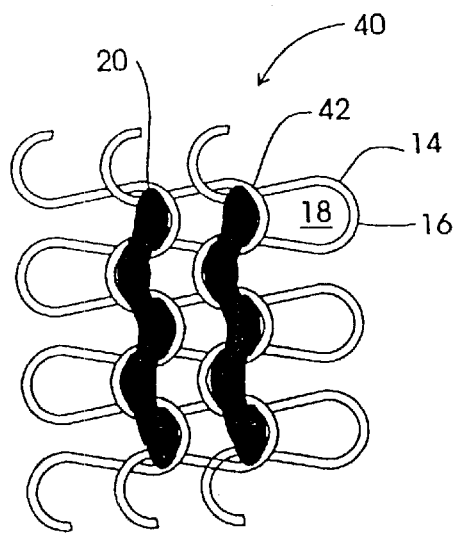
FIG. 4 is a view of a consolidated/heated portion of the fiber mesh member of the EMI shielding gasket of FIG. 1 which is enlarged to detail the structure thereof wherein the fiber mesh member is consolidated within the melted thermoplastic member.
Figure 5:
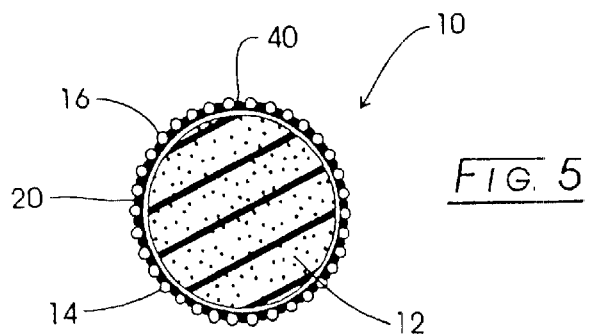
FIG. 5 is a cross-sectional view of the EMI shielding gasket of FIG. 1 taken through line 5—5 of FIG. 1 which line is perpendicular to the longitudinal axis of the gasket.

As is shown, the heated melt of fiber 32 may advantageously flow, wick, or shrink to some extent along conductive fiber 16 to be deposited in the interlocking loop portions or conjunctions, one of which is referenced at 42 in FIG. 4, of fiber mesh member 14 to thereby bind the loops into an integral structure. In this regard, and as is also shown in FIG. 1, the heated melt forming thermoplastic member 20 assumes a generally helical or spiral consolidation pattern which extends circumferentially and axially continuously along the entire extent of fiber mesh member 14 following the helical conjunctions of the knitted loops. Preferably such consolidation pattern forms a generally acute angle with respect to the longitudinal axis, represented at 44 in FIG. 1, of gasket 10. It will be appreciated that the illustrated pattern is especially advantageous in that when gasket 10 is cut or otherwise sectioned along a line generally perpendicular to longitudinal axis 44, at least a portion of thermoplastic member 20 will be sectioned through for consolidating fiber mesh member 14. Although gasket 10 is shown in FIG. 1 as having a generally continuous, helically consolidated portion 40, gasket 10 need not be heated and consolidated along its entire length. Rather, spot heating may be applied to consolidate selected portions of gasket 10 defining sections through which the gasket may be sectioned or ends at which it may be terminated.

Figure 6:
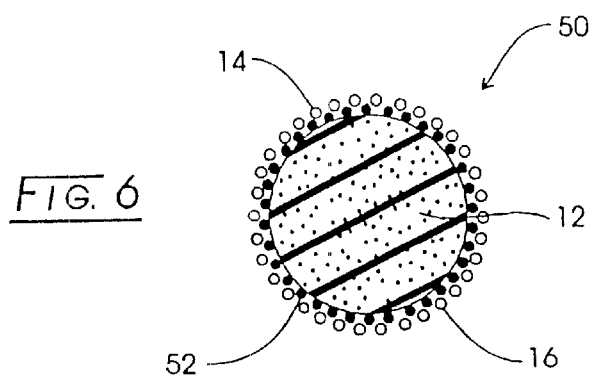
FIG. 6 is a cross-sectional view of an alternative embodiment of an EMI shielding gasket fabricated according to the present invention as having a resilient core member over which is wound an inner thermoplastic fiber member and an outer conductive fiber mesh member.

Looking next to FIG. 6, an alternative embodiment of gasket 10 is presented in cross-section generally at 50. Gasket 50 of the present invention, which is shown for purposes of illustration in an unheated/unconsolidated form, again includes inner core member 12 which is sheathed within conductive fiber mesh member 14. In this embodiment, however, thermoplastic member 20 (FIG. 1) is incorporated within mesh member 14 as a thermoplastic fiber, 52, which is provided directly over a pre-formed core member 12 as a first wound layer, with mesh member 14 being wound over the first wound layer of thermoplastic fiber 52 as a second wound layer. Both these first and second wound layers may be separately formed from a continuous fiber 52 or 16 which is knitted with a circular knitter or the like into respective meshes of a relatively open, looped construction. Alternatively, thermoplastic fiber 52 may be braided, woven, spiraled, or otherwise wrapped around core member 12.

As was thermoplastic fiber 32 (FIG. 3), thermoplastic fiber 52 may be selected as 50–400 denier polyethylene, polypropylene, or Saran7 monofilament or yarn, although other polyolefinic fibers and other thermoplastic fibers formed of a polyamide, polycarbonate, polyester, polyvinyl acetate, or a combination thereof may be substituted. Thermoplastic fiber 52 again generally will comprise from between about 4% to 75% by weight of the consolidated sheathing.

With gasket 50 so formed, it then may be exposed to a stream of hot air or gas, or passed through a heated die to spot or continuously heat thermoplastic fiber 52 for its fusion into thermoplastic member 20 (FIG. 1) which, upon cooling, solidifies to consolidate fiber mesh member 14 into an integral structure. Accordingly, gasket 50 of the present invention may be cut, sectioned, or otherwise terminated to size without unraveling or splaying of the terminal ends thereof.

Figure 7:
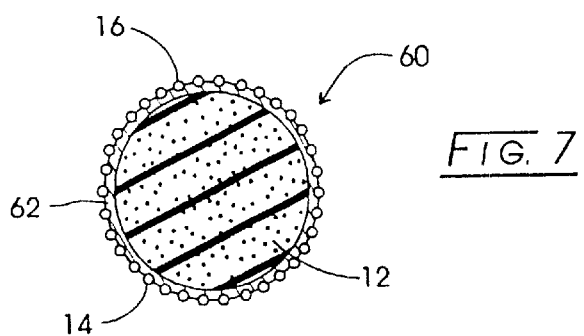
FIG. 7 is a cross-sectional view of another alternative embodiment of an EMI shielding gasket fabricated according to the present invention as having a resilient core member, an inner layer of a thermoplastic wrapped over the core member, and an outer layer of a conductive fiber mesh wound over the thermoplastic film, the thermoplastic film having been heated and melted to consolidate the conductive fiber mesh member.

Referring next to FIG. 7, another alternative embodiment of gasket 10 is presented in cross-section generally at 60. Gasket 60 of the present invention, which is shown for purposes of illustration in a heated/consolidated form, again includes inner core member 12 which is sheathed within conductive fiber mesh member 14. In this embodiment, however, thermoplastic member 20 (FIG. 1) is incorporated within mesh member 14 as a thermoplastic film, 62, which is wrapped directly over a pre-formed core member 12 as a first film layer, with mesh member 14 being wound thereover as a second wound layer. In this regard, thermoplastic film may be wrapped circumferentially continuously around the entire length of core member 12, or, alternatively, around select, axially spaced-apart portions thereof which may define, for example, the ends of the gasket 60.

The first film layer may be formed by feeding the pre-formed core member 12 through a wrap head, while the second wound layer may be formed, as before, from a continuous fiber 16 which is knitted with a circular knitter into a mesh of a relatively open, looped construction. Thermoplastic film 62 may be provided as a 1 to 10 mil thick sheet of bonding film or adhesive formed of a polyolefin, polyamide, polycarbonate, polyester, polyvinyl acetate, or a combination thereof. Thermoplastic film 62 generally will comprise from between about 10% to 75% by weight of the consolidated sheathing.

With gasket 60 so formed, it then may be exposed to a stream of hot air or gas, or passed through a heated die to spot or continuously heat thermoplastic film 62 for its fusion into thermoplastic member 20 (FIG. 1) which, upon cooling, solidifies to consolidate fiber mesh member 14 into an integral structure. Accordingly, gasket 60 of the present invention may be cut, sectioned, or otherwise terminated to size without unraveling or splaying of the terminal ends thereof.

Figure 8:
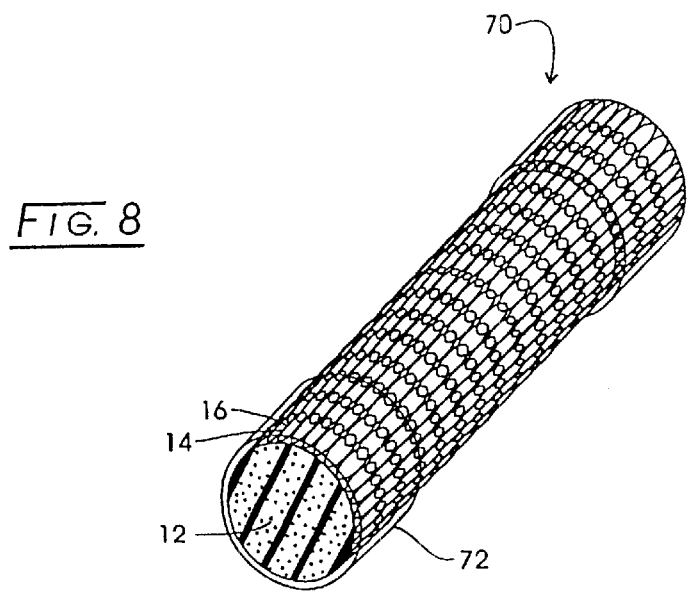
FIG. 8 is a perspective view of another alternative embodiment of an EMI shielding gasket fabricated according to the present invention as having an conductive fiber mesh member wound over a core member, and a thermoplastic film wrapped over the fiber mesh member at locations defining ends of the gasket for sectioning, the thermoplastic film having been heated to melt and consolidate the fiber mesh member.

Turning lastly to FIG. 8, yet another alternative embodiment of gasket 10 is presented in perspective generally at 70. Gasket 70 of the present invention, which is shown for purposes of illustration in a heated/consolidated form, again includes inner core member 12 which is sheathed within conductive fiber mesh member 14. In this embodiment, however, thermoplastic member 20 (FIG. 1) is incorporated within mesh member 14 as a thermoplastic film, referenced at 72, which is wrapped over a preformed core member 12 and knitted mesh member 14 to form a consolidated outer layer which, again, is to be contrasted with the mere binding of the sheathing to the core with a pressure sensitive adhesive or the like. As before, mesh member 14 may be formed from a continuous fiber 16 which is knitted with a circular knitter into a mesh of a relatively open, looped construction. Thermoplastic film 72 then may be wrapped circumferentially continuously over the entire length mesh member 14, or, alternatively, over select, circumferentially-continuous, but axially spaced-apart portions thereof such as, for example, at a terminal end of gasket 70. In this regard, thermoplastic film 72 again may be provided as a 1 to 10 mil thick sheet of bonding film or adhesive which is formed of a polyolefin, polyarnide, polycarbonate, polyester, polyvinyl acetate, or a combination thereof. Thermoplastic film 72 generally will comprise from between about 10% to 75% by weight of the consolidated sheathing.

With gasket 70 so formed, it then may be exposed to a stream of hot air or gas, or passed through a heated die to spot or continuously heat thermoplastic film 72 for its fusion into thermoplastic member 20 (FIG. 1) which, upon cooling, solidifies to consolidate fiber mesh member 14 into an integral structure. Accordingly, gasket 70 of the present invention may be cut, sectioned, or otherwise terminated to size without unraveling or splaying of the terminal ends thereof.

The following Examples are illustrative of the precepts of the present invention, but should not be construed in any limiting sense.

EXAMPLES

Example 1

An experiment was conducted to confirm the feasibility of the precepts of the present invention. A 300 denier, polypropylene yarn was co-spooled with a 108 denier, nylon yarn having about 20% by weight of a silver plating thereon. Using a circular knitter, the cospooled yarns were knitted as a continuous fiber in an open, looped mesh sheathing over a 0.02 inch (0.5 mm) by 0.02 inch (0.5 mm) core of an open-cell urethane foam. The polypropylene yarn comprised about 74% by weight of the sheathing.

The resulting sample was cut and heated to a temperature about the melting point of the polypropylene yarn. Although some degradation of the foam core was observed at that temperature, it was observed that the polypropylene did melt sufficient to consolidate the conductive yam of the mesh into an integral structure. On sectioning of the heated sample, no unraveling of the sheathing was observed.

The resistance of the heated/consolidated sample then was measured using a pair of silver-coated platens between which the sample was compressed about to about 50% of its original thickness. Resistance measurements were obtained with a 4-lead ohm meter. It was observed that the resistance of the consolidated sample compared favorably to that of a reference sample having no thermoplastic member. Thus, it was concluded that the above-described termination method should have no appreciable effect on the EMI shielding effectiveness of gaskets fabricated in accordance therewith.

Example 2

A 0.25 inch (6.35 mm) by 0.25 inch (6.35 mm) pre-formed core of an open-cell urethane foam was fed into a wrap head wherein a 2.5 mil (0.0635 mm) thick thermoplastic polyamide bonding film was wrapped over the core. The wrapped foam core then was fed into a circular knitter wherein a 108 denier, nylon yarn having about 20% by weight of a silver plating thereon was knitted thereover as a continuous fiber in an open, looped mesh sheathing.

The resulting sample was cut and heated to a temperature above the melting point of the polyamide film. It was observed that the polyamide film was melted sufficient to consolidate the conductive yarn of the mesh into an integral structure. The polyamide film was estimated to comprise about 73% by weight of the sheathing.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed:

1. A gasket structure for shielding against electromagnetic and radio frequency interference, said gasket structure comprising:
   a core;
   a first tubular layer formed from a hot melt yarn and having a length and a transverse dimension, said first tubular layer circumferentially and longitudinally enveloping said core; and
   a second tubular structure formed from a conductive yarn and having a length and a transverse dimension, said second tubular structure being disposed over at least a portion of said first tubular layer;
   wherein said hot melt yarn forming said first tubular layer adheres said second tubular structure to said core at a plurality of contact points such that fraying of said gasket structure is substantially prevented.

2. The gasket structure according to claim 1, wherein said core includes a neoprene sponge.

3. The gasket structure according to claim 1, wherein said conductive yarn includes a nylon yarn plated with silver.

4. The gasket structure according to claim 1, wherein said first tubular layer is knitted from said hot melt yarn.

5. The gasket structure according to claim 4, wherein said knitted first tubular layer is formed by circular knitting.

6. The gasket structure according to claim 1, wherein said second tubular structure is knotted from said conductive yarn.

7. The gasket structure according to claim 6, wherein said knitted second tubular structure is formed by circular knitting.

8. The gasket structure according to claim 7, wherein said conductive yarn includes a nylon yarn plated with tin.

9. The gasket structure according to claim 6, wherein said conductive yarn includes a nylon yarn plated with aluminum.

10. The gasket structure according to claim 1, wherein said core includes an elastomer foam.

* * * * *